United States Patent
Vasudev et al.

(10) Patent No.: US 6,482,746 B2
(45) Date of Patent: Nov. 19, 2002

(54) COMPUTER READABLE MEDIUM FOR CONTROLLING A METHOD OF CLEANING A PROCESS CHAMBER

(75) Inventors: Anand Vasudev, San Jose, CA (US); Toshio Itoh, Palo Alto, CA (US); Ramamujapuram A. Srinivas, San Jose, CA (US); Frederick Wu, Cupertino, CA (US); Li Wu, Fremont, CA (US); Brian Boyle, San Francisco, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/874,882

(22) Filed: Jun. 5, 2001

(65) Prior Publication Data

US 2001/0027030 A1 Oct. 4, 2001

Related U.S. Application Data

(62) Division of application No. 09/163,711, filed on Sep. 30, 1998, now Pat. No. 6,242,347.

(51) Int. Cl.[7] .............................................. H01L 21/302
(52) U.S. Cl. ........................ 438/714; 438/706; 438/680; 438/906
(58) Field of Search ................................ 438/680, 905, 438/706, 714; 216/2, 67, 70; 134/1.1, 21, 22.1

(56) References Cited

U.S. PATENT DOCUMENTS

| | | | |
|---|---|---|---|
| 4,717,806 A | 1/1988 | Battey et al. | 219/121 PE |
| 4,842,683 A | 6/1989 | Cheng et al. | 156/345 |
| 5,068,002 A | 11/1991 | Monroe | 156/345 |
| 5,158,644 A | 10/1992 | Cheung et al. | 156/643 |
| 5,207,836 A | 5/1993 | Chang | 134/1 |
| 5,294,262 A | 3/1994 | Nishimura | 134/22.1 |
| 5,356,478 A | * 10/1994 | Chen et al. | 134/1 |
| 5,507,874 A | 4/1996 | Su et al. | 134/1 |
| 5,817,578 A | * 10/1998 | Ogawa | 438/714 |
| 5,926,743 A | 7/1999 | Xi et al. | 438/905 |
| 6,136,211 A | 10/2000 | Qian et al. | 216/37 |
| 6,189,482 B1 | * 2/2002 | Zhao et al. | 118/723 R |

FOREIGN PATENT DOCUMENTS

| | | | | |
|---|---|---|---|---|
| JP | 03-062520 | 3/1991 | | H01L/21/302 |
| JP | 10-256192 | 9/1998 | | H01L/21/285 |
| WO | 94/00251 | 1/1994 | | B08B/3/10 |

* cited by examiner

*Primary Examiner*—Richard Elms
*Assistant Examiner*—Brad Smith
(74) *Attorney, Agent, or Firm*—Moser, Patterson & Sheridan

(57) ABSTRACT

A method for the in situ cleaning of a semiconductor deposition chamber utilized for the deposition of a semiconductor material such as titanium or titanium nitride comprising, between wafers, introducing chlorine gas into the chamber at elevated temperature, purging the chamber with an inert gas and evacuating it before introduction of the next wafer. A two-stage between wafer cleaning process is carried out by introducing chlorine into the chamber at elevated temperature, thereafter initiating a plasma without removing the chlorine, purging the chamber with an inert gas and evacuating it before introduction of the next wafer. In a preferred embodiment, a thin protective film of titanium is deposited on the inner surfaces of the chamber prior to utilizing the chamber for he deposition of such material. The protective layer is replenished following each two-stage cleaning.

25 Claims, 3 Drawing Sheets

COMPUTER READABLE MEDIUM FOR CONTROLLING A METHOD OF CLEANING A PROCESS CHAMBER

This application is a divisional of copending U.S. patent application Ser. No. 09/163,711, filed Sep. 30, 1998, now U.S. Pat. No. 6,242,347, which is hereby incorporated by reference in its entirety.

BACKGROUND OF THE DISCLOSURE

1. Field of the Invention

This invention relates to a method for the in situ cleaning of a process chamber. Specifically, a chlorine-based cleaning is performed in a chemical vapor deposition ("CVD") chamber to improve deposition process conditions and wafer-to-wafer repeatability.

2. Description of the Background Art

Semiconductor processing typically is carried out in specialized apparatus comprised of multiple chambers wherein wafers are processed by the deposition and various treatments of multiple layers of semiconductor material in a single environment. In such tools, the plurality of processing chambers and preparatory chambers are arranged in clusters, each served by robotic transfer means. Hence, such tools are commonly referred to as cluster tools. Such tools process semiconductor wafers through a plurality of sequential steps to produce integrated circuits.

Regardless of whether semiconductor processing apparatus is configured as described above or in other arrangements known to those skilled in the art, it will be appreciated that the objective is simply to process the greatest number of wafers per unit of time in the most efficient manner. However, it is characteristic of all such apparatus that active chambers, i.e. those wherein semiconductor material is deposited or treated in some other manner, such as etching, must periodically be cleaned of the residues inherently formed during such procedures. It will further be appreciated that it is desirable to have as high a throughput as possible without sacrifice of the quality of the operation carried out in a deposition chamber before it must be cleaned.

One particularly desirable feature of cleaning a deposition chamber is to perform the cleaning in situ, i.e. without the necessity of removing the chamber from the cluster tool or exposing the chamber to oxidizing elements present in the atmosphere. In situ cleaning would mean that the cluster tool would not have to be turned off while one or more chambers are cleaned. This is particularly advantageous when it is considered that chambers where different semiconductor processes are carried out become unsuitable for efficient processing at different rates and, hence, do not require cleaning at the same time. Therefore, a process whereby one or more chambers in a multiple chamber tool can be cleaned while others continue to perform their function in the process is particularly advantageous. A cleaning process that meets the needs described above is provided in accordance with the present invention.

SUMMARY OF THE INVENTION

The disadvantages associated with the prior art are overcome by the present invention of a method of cleaning a process chamber. In accordance with the present invention, wafer-to-wafer repeatability for wafers individually undergoing chemical vapor deposition of metals such as titanium or materials such as titanium nitride, is enhanced by a brief thermal cleaning step between wafers utilizing chlorine as the cleaning gas. This cleaning step significantly extends the interval, in number of wafers processed, before the deposition chamber must be cleaned. In a second aspect of the invention, the deposition chamber may be cleaned in situ by performing a first stage thermal clean utilizing chlorine as the cleaning gas and then carrying out a second stage clean by exciting the cleaning gas with a plasma. The method may also comprise the step of depositing a protective coating of material in the chamber following the two-stage deposition chamber clean. Such a protective coating is titanium that is deposited on the interior surfaces of the chamber by chemical vapor deposition and can be between about 50 Å and 1$\mu$ thick.

Additionally, in a system for controlling the process sequence of wafers through a semiconductor wafer processing tool containing a plurality of chambers, at least two of which are performing the deposition of titanium or titanium nitride, a general purpose computer system that operates as a special purpose controller when executing a cleaning program for such chambers performs a process including the steps of cleaning the chamber between wafers by thermally energized chlorine, monitoring the conditions in the chamber, invoking a decision to clean the chamber, performing a two-stage clean of the chamber consisting of a thermal chlorine clean followed by a plasma chlorine clean and returning the chamber to the processing sequence being carried out. The computer readable medium may further perform the additional step after the two-stage clean and prior to returning the chamber to the processing sequence of depositing a protective coating of titanium on the interior surfaces of the chamber.

With the method as described herein, wafer-to-wafer repeatability is enhanced and throughput of a wafer processing system is optimized as there is little or reduced down time for the system as a whole. The vacuum environment of the system is not broken thereby allowing wafers to be processed in another chamber while the cleaning operation is being performed in a selected chamber.

BRIEF DESCRIPTION OF THE DRAWINGS

The teachings of the present invention can be readily understood by considering the following detailed description in conjunction with the accompanying drawings, in which.

DETAILED DESCRIPTION OF THE INVENTION

Figure 1:
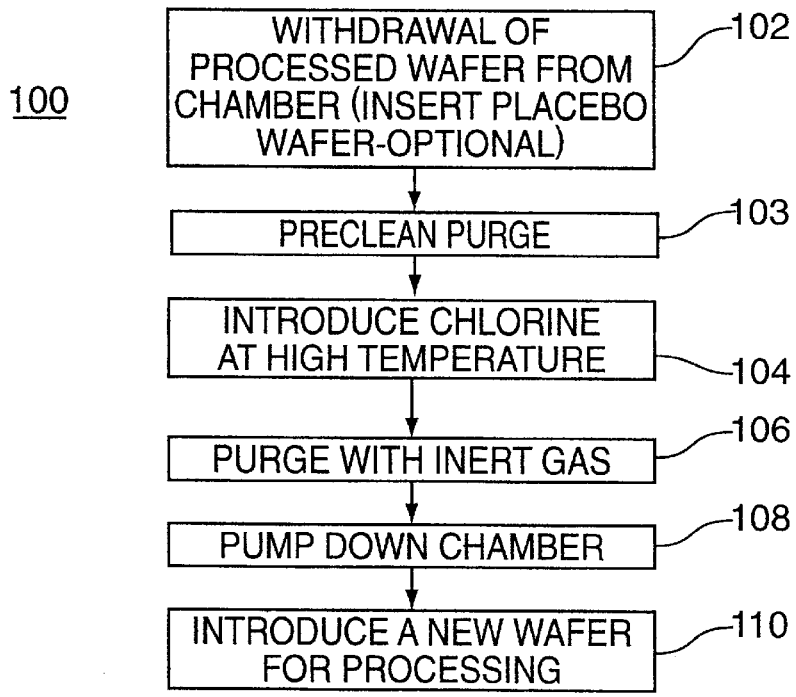
FIG. 1 illustrates a sequence of steps of the thermal cleaning process to be carried out between wafers being processed in accordance with the present invention.

The present invention is directed to an improvement in the cleaning of deposition chambers in multistep semiconductor processing apparatus where deposition of certain materials, particularly titanium or titanium nitride, is performed by chemical vapor deposition ("CVD"). Typically, in CVD deposition of titanium or titanium nitride, a precursor gas is admitted to the chamber and thermally decomposed to deposit the material on a target wafer that is suitably biased. The deposition of titanium is usually plasma enhanced in that an RF plasma is created in the chamber to further bias the wafer and enhance decomposition of the precursor.

Although various organic titanium precursor compounds, including certain organic compounds, are utilized to deposit titanium films by CVD, it is preferred for a number of reasons to utilize titanium tetrachloride ($TiCl_4$) as the precursor compound. $TiCl_4$ is admitted to the chamber, typically in combination with a carrier gas such as argon and a reactant gas such as hydrogen. The decomposition of the $TiCl_4$ results in the deposition of titanium on the target wafer and the formation of HCl and other by-products. Most of these by-products are evacuated to prevent contamination of the deposited film formed on the wafer. There may or may not be an argon plasma added to enhance the overall effect of the deposition process. Although the described deposition is a CVD of titanium, this does not preclude the deposition of other material such as CVD TiN and the like. Such a process is described in commonly assigned application Ser. No. 08/982,872, filed Dec. 2, 1997 and herein incorporated by reference. An example of a suitable chamber and cluster tool capable of performing CVD in the manner described is the TixZ chamber and the Centura 5200 mainframe both manufactured and sold by Applied Materials, Inc. of Santa Clara, Calif.

The cleaning process of the present invention comprises both a single stage and a two-stage cleaning, the latter being markedly more aggressive. The cleaning process of the present invention materially improves wafer-to-wafer repeatability and permits a single deposition chamber to process a significant number of wafers with CVD titanium before a periodic cleaning is required. Those skilled in the art appreciate that problems in automated semiconductor processing systems are frequently associated with residual particles in the deposition chamber. The fact that the cleaning process of the present invention reduces such problems represents a significant increase in both wafer-to-wafer repeatability and throughput which is of considerable commercial interest. As will be readily apparent to those skilled in the art, throughput for a given apparatus will vary depending primarily on the processes being performed therein. While the cleaning process of the present invention may be utilized in a number of processes, it is most useful in connection with a CVD titanium or titanium nitride process, particularly one utilizing titanium tetrachloride as the precursor gas.

In the $TiCl_4$ deposition process, as is the case with any such process, the build-up of impurities, i.e., the aforementioned by-products, as well as the unintended deposition of material on certain surfaces, such as a substrate heater, walls and faceplate or lid of the deposition chamber must be periodically removed in order to maintain the repeatability of the deposition process. Repeatability in the context of the present process is defined as preventing or minimizing a decrease in the deposition rate in a CVD process and/or a material change in a process parameter. The parameter utilized to measure repeatability is the sheet resistance of the layer being deposited by CVD since both a loss of deposition rate and a material change in a process parameter will be manifest as a change is sheet resistance. in accordance with the present invention and referring to FIG. 1, a thermal chlorine clean, depicted as a sequence of steps 100, is performed between processing of individual wafers in a deposition chamber. The method starts at step 102 which is withdrawal of a wafer which has completed processing, i.e. chemical vapor deposition, in the chamber. Optionally, in step 102, a placebo wafer is inserted into the chamber. The placebo wafer is used to protect the substrate heater during the cleaning process. In a preferred embodiment of the invention, the placebo wafer is a quartz disk having the same size and shape as a semiconductor wafer. In step 103, a pre-clean purge is performed in the chamber. Specifically, an inert gas such as argon, helium or nitrogen is pumped into the chamber and exhausted to purge the chamber of deposition byproducts. In step 104, the chlorine gas is admitted to the chamber under elevated temperature, approximately 500–700° C., at a pressure between approximately 0.5–50 Torr and preferably 1 Torr. While pure chlorine can be utilized in the cleaning process of the invention, it is preferably mixed with up to about 99.9% by volume of an inert diluent gas such as argon, nitrogen or helium, preferably argon. The thermal chlorine clean is carried out for from about 5 to 60 seconds, preferably about 10 seconds.

Following the thermal chlorine clean step 104, the flow of chlorine is stopped and the chamber is purged in step 106 with the inert diluent gas. Specifically, the inert diluent gas, preferably argon, is pumped into the chamber to a pressure of from about 0.5–50 Torr and preferably 3 Torr for from about 1 second to 10 seconds, preferably about 5 seconds. In step 108, the chamber is pumped down to a final pressure of from about 5 to 150 mtorr, preferably from about 40–50 mTorr. Finally, in step 110, a new wafer is introduced into the chamber for processing.

While it is understood that the above-discussed thermal cleaning sequence 100 is performed between processing of individual wafers, the sequence can also be run on a periodic basis between a group of wafers. For example, process parameters are monitored to make a determination as to when the periodic sequence is initiated. Such parameters include but are not limited to wafer count, sheet resistance of a deposited film or the like. Upon such determination, the periodic sequence is performed according to the same steps as those for the "between wafer sequence" 100 with slight variation.

Specifically, after a wafer count of approximately 200–250 wafers, the method starts at step 102 with withdrawal of a wafer which has completed processing, i.e. chemical vapor deposition, in the chamber and optional insertion of a placebo wafer. In step 103, a pre-clean purge is performed in the chamber. Specifically, an inert gas such as argon, helium or nitrogen is pumped into the chamber and exhausted to purge the chamber of deposition byproducts. In step 104, the chlorine is admitted to the chamber under elevated temperature, approximately 500–700° C., at a pressure between approximately 0.5–50 Torr and preferably 20 Torr. While pure chlorine can be utilized in the cleaning process of the invention, it is preferably mixed with up to about 99.9% by volume of an inert diluent gas such as argon, nitrogen or helium, preferably argon. The thermal chlorine clean is performed for approximately 200–1000 seconds and preferably 500 seconds.

Following the thermal chlorine clean step 104, the flow of chlorine is stopped and the chamber is purged in step 106 with the inert diluent gas. Specifically, the inert diluent gas, preferably argon, is pumped into the chamber to a pressure of from about 0.5–50 Torr and preferably 3 Torr. The chamber is then pumped down to a pressure of from about 5–150 mTorr. This pump up and pump down cycle is repeated for from about 1–20 cycles and preferably 10–15 cycles. This repeated cycling of inert, diluent gas removes particles and residual gases from the chamber. In step 108, the chamber is pumped down to a final pressure of from about 5 to 150 mTorr. Finally, in step 110, a new wafer is introduced into the chamber for processing.

Figure 2:
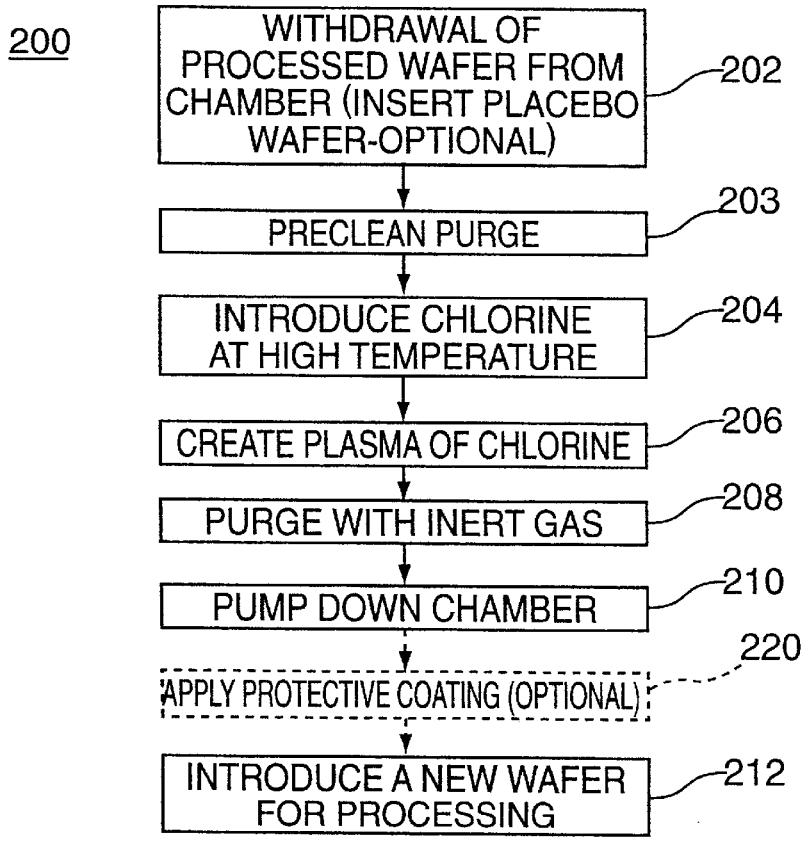
FIG. 2 illustrates the two-stage cleaning process as contemplated in the present invention.

An alternate method for cleaning a process chamber is shown in FIG. 2. Specifically, a two-stage cleaning process is executed as a "between wafer sequence" 200. That is, the process is run after every time a wafer is processed in the chamber. As in FIG. 1, the process illustrated in FIG. 2, begins with withdrawal of the wafer being processed and optional insertion of a placebo wafer in step 202. In step 203, a pre-clean purge is performed in the chamber.

Specifically, an inert gas such as argon, helium or nitrogen is pumped into the chamber and exhausted to purge the chamber of deposition byproducts. The first stage clean is performed by introducing a flow of pure chlorine gas or a mixture of up to about 99.9% by volume of an inert gas as described above with the chlorine gas into the chamber under high temperature (in the range of approximately 500–700° C. and preferably 650° C.) in step 204. The chamber pressure is regulated to be in the range of approximately 0.5–50 Torr and preferably 20 Torr. This first stage clean is carried out for from about 5 to 50 seconds, preferably about 20 seconds.

In the second stage clean, a different form of energy, i.e. a plasma, is utilized. Without withdrawing the chlorine from the chamber, RF power is applied to the chamber to initiate a chlorine plasma 206 under the same temperature conditions as the thermal clean step 204. The chamber pressure is regulated to be in the range of approximately 0.5–10 Torr and preferably 0.8 Torr. The RF power is in the range of approximately 50–900 watts, preferably 100 to 200 watts. The plasma clean step 206 is preferably shorter than the thermal clean step 204 and is performed for from about 2 to 20 seconds, preferably about 5 seconds. Following the plasma clean 206, the deposition chamber is purged at step 208 with inert gas, as described above with reference to the "between wafer sequence" 100 shown in FIG. 1. In the purge step 208, the flow of pure chlorine gas or mixture thereof is halted and the power is reduced to about one-half of the level utilized for the plasma step 206. This reduces the pressure in the chamber from about 0–1 Torr and preferably 0.5 Torr. In this way, the plasma is spread out in the chamber yet maintains suspended particles so that they can be pumped out of the chamber. The chamber is next pumped down at step 210 for about 20 seconds to a final pressure of from about 5 to 150 mTorr. Finally, in step 212, a new wafer is introduced into the chamber for processing.

The combination of the thermal chlorine clean followed by the shorter plasma clean provides excellent control of the cleaning operation with a minimum of risk to the deposition chamber components. The high efficiency of the two-stage chlorine clean provided in accordance with the process of the invention enables cleaning of deposition chambers to be carried out in situ after every wafer thereby minimizing downtime for the deposition semiconductor processing apparatus. Specifically, it has been realized that running process 200 after every wafer is so effective that a periodic or extended clean step or some other similar maintenance step is not required to maintain chamber conditions.

In a further alternate embodiment of the present invention, the internal surfaces of the deposition chamber are coated with a protective coating, preferably titanium or titanium nitride, to provide protection against the subsequent cleaning stages. This coating protects chamber components, i.e. the substrate heater, pedestal, walls, roof and the like during the cleaning process. The protective coating is applied following the pump down step 210 of the two-stage cleaning process illustrated in FIG. 2 shown as optional step 220 and is performed simply by conducting the CVD deposition process without a wafer on the pedestal and without biasing the pedestal so a deposited material forming the protective coating may be deposited on all of the exposed surfaces of the deposition chamber.

The protective coating must be sufficiently thick to protect the deposition chamber components during the cleaning stages, yet not so thick that it would in any way interfere with the normal deposition process. In general, it is preferred that the deposition material is titanium and preferably, the protective coating has a thickness of between about 50 Å and 1$\mu$ thick. Those of ordinary skill in the art will readily be able to deposit a titanium coating of the requisite thickness by reference to the deposition capability of the specific apparatus being used.

It will be appreciated that, in the embodiment of the present invention utilizing a protective coating, the initial processing of wafers is begun in a deposition chamber having a protective coating in place and, therefore, the application of the protective coating described above is, in reality, a replenishment. The protective coating is particularly useful in protecting the heating element of the deposition chamber which is conventionally aluminum nitride. Without the coating, chlorine will attack (i.e., etch) the surface of the heating element which will subsequently create contaminants that condense and redeposit as aluminum chloride on the cooler chamber surfaces as wafers are processed. The degree of deposition of aluminum chloride may be a factor in reaching a decision to initiate step 220 of the two-stage cleaning illustrated in FIG. 2. Preferably, however, the decision may be triggered by reaching a predetermined number of wafers processed in the deposition chamber since the last cleaning, or be the result of periodic monitoring of one or more chamber parameters, or by direct inquiry of an operator or the like. If it is determined that the chamber does not require cleaning, the deposition chamber continues to process wafers.

Figure 4:
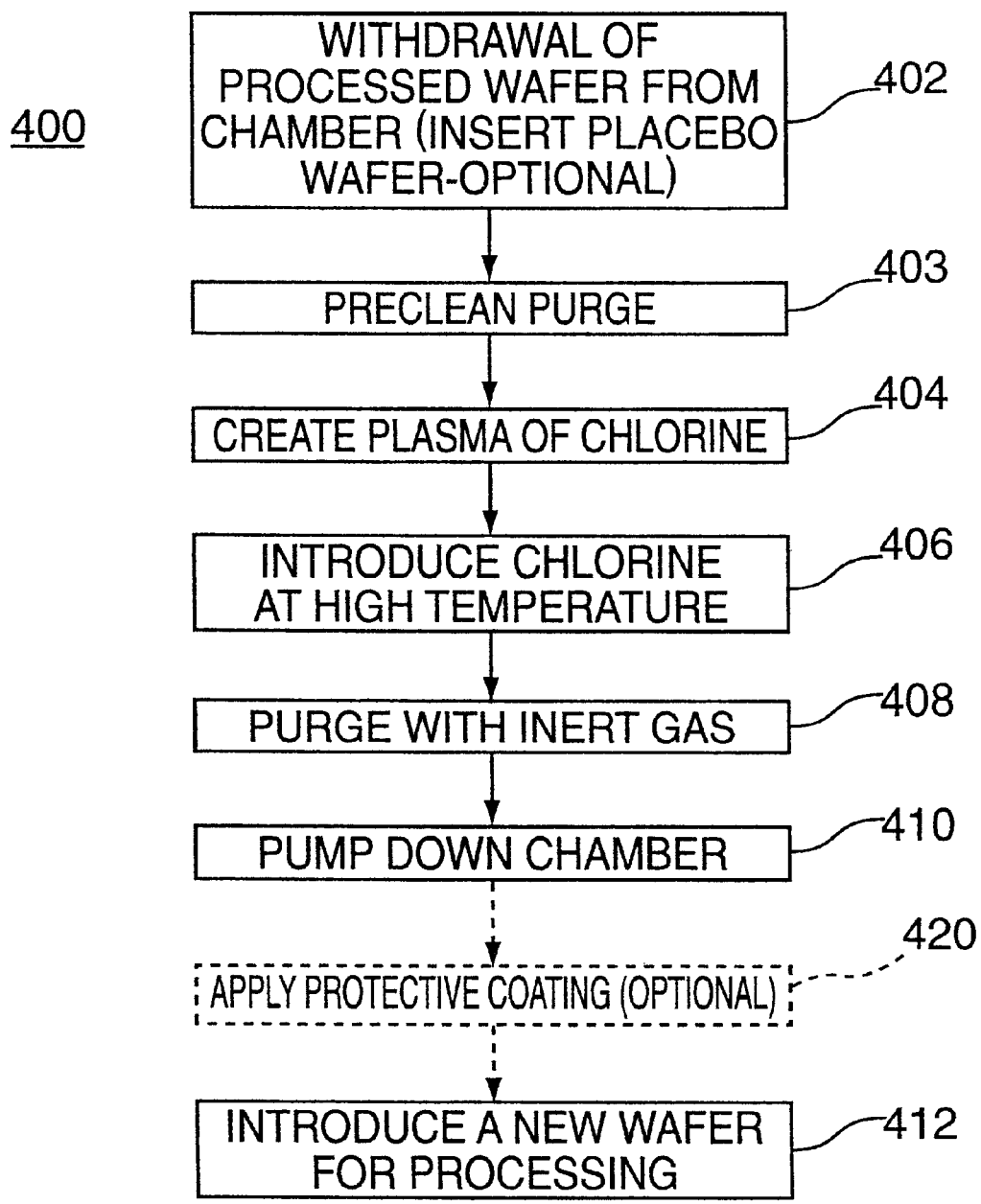
FIG. 4 depicts an alternate embodiment of the two-stage cleaning process of the present invention.

FIG. 4 depicts an alternate embodiment of the two-stage cleaning process 400. Essentially, process 400 is identical to process 200 in terms of the parameters established for each of the steps. The only significant difference between these two methods is the order of the cleaning stages. Specifically: steps 402 and 403 are identical to steps 202 and 203 respectively; a plasma clean step 404 and a thermal clean step 406 of process 400 are identical to steps 206 and 204 respectively of process 200 except that they are interchanged. That is, the plasma is initiated first to plasma clean the chamber, then the plasma is halted and the thermal clean is performed. Steps 408, 410, 412 and optional step 420 are identical to steps 208, 210, 212 and optional step 220 respectively. It is offered that the overall two stage cleaning process is effective regardless of the order of the individual cleaning stages.

The cleaning process provided herein is particularly advantageous when utilized in semiconductor processing tools comprised of multiple chambers wherein wafers are prepared and processed by the deposition of and treatment of multiple layers of semiconductor material in a single apparatus served by robotic transfer mechanisms. Such a tool is described in commonly assigned U.S. Pat. No. 5,186,718 issued Feb. 16, 1993 to Tepman et al. In such tools where extra chambers may be available, or the same process step may be carried out in more than one chamber, it is possible to utilize the in situ clean of the invention without any downtime for the apparatus. This is clearly a primary advantage of the subject process.

Figure 3:
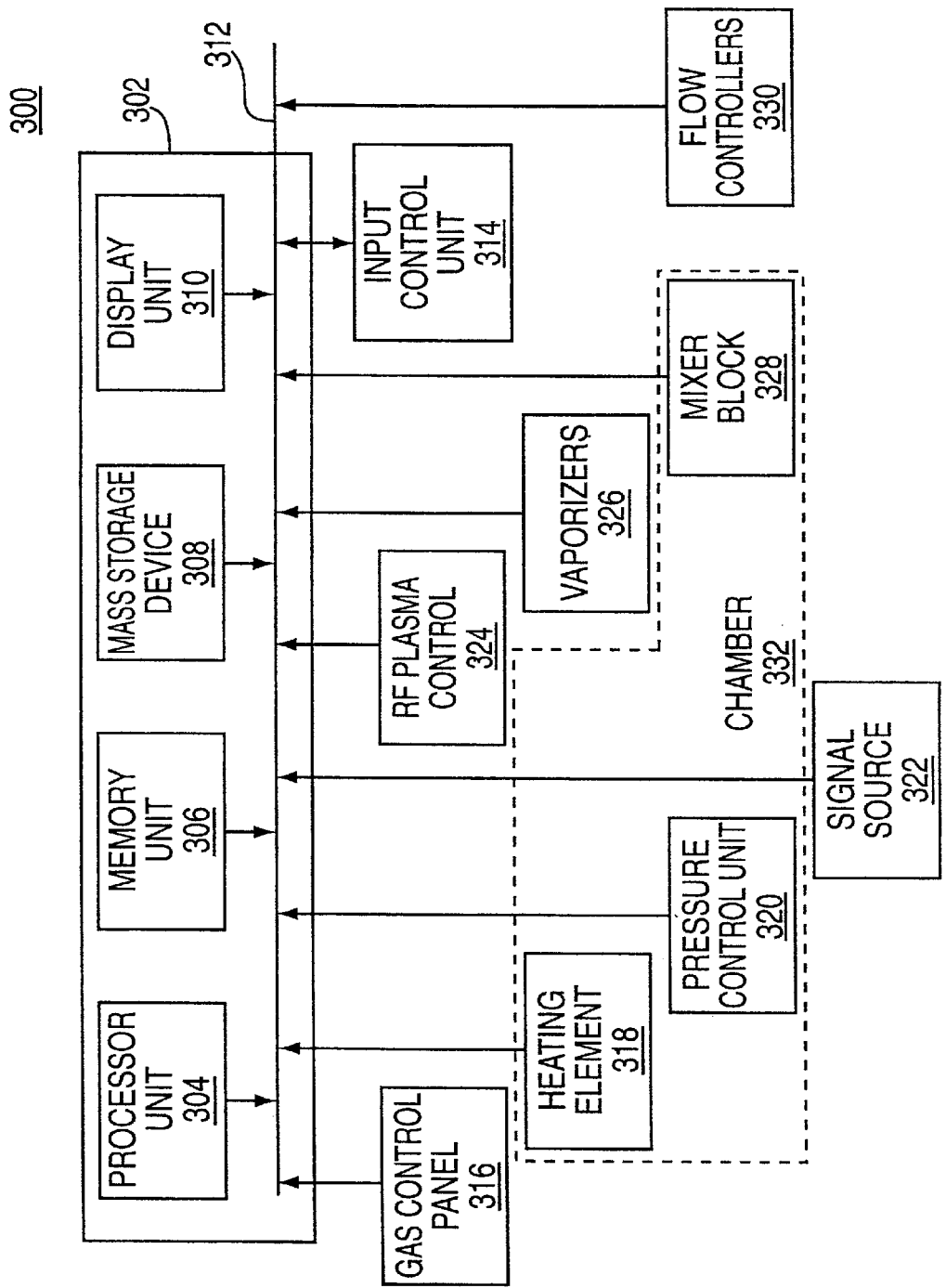
FIG. 3 illustrates a block diagram of a control system that is employed in accordance with the present invention to control the operation and cleaning of a deposition chamber that is used for depositing titanium by CVD in accordance with the present invention.

The above-described process steps, as illustrated in FIGS. 1, 2 and 4 are advantageously performed in a system that is controlled by a processor-based control unit. FIG. 3 shows a block diagram of a deposition system 300 having a control unit 302 that can be employed in such a capacity. The control unit 302 includes a processor unit 304, a memory 306, a mass storage device 308, an input control unit 314, and a display unit 310 which are all coupled to a control unit bus 312.

The processor unit 304 forms a general purpose computer that becomes a specific purpose computer when executing programs such as a program for implementing deposition and cleaning process of the present invention. Although the invention is described herein as being implemented in software and executed upon a general purpose computer, those skilled in the art will realize that the method of the present invention could be operated using hardware such as an application specific integrated circuit (ASIC) or other hardware circuitry. As such, the invention should be understood as being able to be implemented, in whole or in part, in software, hardware or both.

The processor unit 304 is either a microprocessor or other engine that is capable of executing instructions stored in a memory. The memory 306 can be comprised of a hard disk drive, random access memory ("RAM"), read only memory ("ROM"), a combination of RAM and ROM, or another processor readable storage medium. The memory 306 contains instructions that the processor unit 304 executes to facilitate the performance of the above mentioned process steps. The instructions in the memory 306 are in the form of program code. The program code may conform to any one of a number of different programming languages. For example, the program code can be written in c+, C++, BASIC, Pascal, or a number of other languages.

The display unit 310 provides information to a chamber operator in the form of graphical displays and alphanumeric characters under control of the processor unit 304. The input control unit 314 couples a data input device, such as a keyboard, mouse, or light pen, to the control unit 302 to provide for the receipt of input from an operator or from the computer system operating a complex processing tool.

The control unit bus 312 provides for the transfer of data and control signals between all of the devices that are coupled thereto. Although the control unit bus 312 is displayed as a single bus that directly connects the devices in the control unit 302, the control unit bus 312 can also be a collection of busses. For example, the display unit 310, input control unit 314 and mass storage device 308 can be coupled to an input-output peripheral bus, while the processor unit 304 and memory 306 are coupled to a local processor bus. The local processor bus and input-output peripheral bus are coupled together to form the control unit bus 312.

The control unit 302 is coupled to the chamber 332 via a plurality of elements of the deposition system 300, employed in depositing a protective coating on the exposed surfaces of the chamber, depositing material on wafers being individually passed through the chamber and cleaning of the chamber, all in accordance with the present invention. Although each of these elements are not physically contained within the chamber 332, they are connected to the chamber to alter the chamber environment to create the desired conditions (e.g., temperature, pressure and gas flow rate for two-stage cleaning as described above). For example, gas control panel 316, vaporizer 326 and flow controllers 330 are connected to the chamber 332 via one or more fluid transfer lines (not shown). Likewise, RF plasma control 324 and signal source 322 are connected to the chamber 332 via one or more electrical lines (not shown). Each of the elements is coupled to the control unit bus 312 to facilitate communication between the control unit 302 and the elements. The elements include the gas control panel 316, the heating element 318, the pressure control unit 320, the signal source 322, the RF plasma control 324, vaporizers 326, the mixer block 328 and flow controllers 330. The control unit 302 provides signals to the chamber elements that cause the elements to perform the operations required for the process steps described above. In operation, the processor unit 302 directs the operation of the chamber elements in response to the program code instructions that it retrieves from the memory unit 306. In response to these instructions, the chamber elements are directed to perform the process steps described above.

In addition, the general purpose computer control system utilized in semiconductor processing tools typically has the capability to determine when a particular chamber being used to perform a step in a multiple step sequence must be taken off-line for cleaning. This capability is provided through real-time analytical determinations or by relying on predetermined restrictions on the number of wafers that can be processed without significant risk of inability to meet specifications.

The present invention is advantageous for such a control system where more than one chamber is being utilized to carry out titanium deposition. For example, the computer can take one such chamber off-line, perform the two stage chlorine cleaning and optionally carry out a titanium deposition as described above prior to wafer processing (i.e., Ti deposition). There is no down time for the apparatus as a whole since wafers to be processed while the cleaning operation is being performed in a given chamber are diverted to another chamber.

Although the present invention has been described in terms of particular embodiments, numerous changes can be made thereto as will be known to those skilled in the art. The invention is only meant to be limited in accordance with the limitations of the appended claims.

We claim:

1. In a system for controlling the process sequence of wafers through a semiconductor processing tool containing at least one chamber for performing the deposition of a material selected from the group consisting of titanium and titanium nitride, a computer readable medium in a general purpose computer system that operates as a special purpose controller when executing a cleaning program for said at least one chamber to perform a process comprising the steps of:

a) introducing chlorine gas into said at least one chamber at elevated temperature to execute the in situ cleaning thermally;

b) purging said at least one chamber with an inert gas; and c) pumping down said at least one chamber to remove the contents thereof.

2. The computer readable medium in accordance with claim 1, wherein said wafers are being processed by chemical vapor deposition.

3. The computer readable medium in accordance with claim 1, wherein a material deposited by chemical vapor deposition is selected from the group consisting of titanium nitride and titanium and a precursor for same is titanium tetrachloride.

4. The computer readable medium in accordance with claim 1, wherein the elevated temperature is in the range of approximately 500–700° C.

5. The computer readable medium in accordance with claim 1, wherein step a) is performed for approximately 5–60 seconds.

6. The computer readable medium in accordance with claim 1, wherein the chlorine gas in step a) is admixed with up to 99.9% by volume of an inert gas.

7. The computer readable medium in accordance with claim 6, wherein the inert gas is selected from the group consisting of argon, nitrogen and helium.

8. The computer readable medium in accordance with claim 6, wherein the inert gas utilized in step b) is the same as utilized in step a).

9. The computer readable medium in accordance with claim 1 further comprising the step of inserting a placebo wafer into the chamber prior to step a).

10. The computer readable medium in accordance with claim 1 further comprising the step of purging the chamber prior to step a).

11. In a system for controlling the process sequence of wafers through a semiconductor processing tool containing at least one chamber for performing the deposition of a material selected from the group consisting of titanium and titanium nitride, a computer readable medium in a general purpose computer system that operates as a special purpose controller when executing a cleaning program for said at least one chamber to perform a process comprising the steps of:

a) introducing chlorine gas into said at least one chamber at elevated temperature to partially execute the in situ cleaning thermally;

b) maintaining the conditions of step a), initiating a plasma containing chlorine in said at least one chamber to further execute the in situ cleaning;

c) purging said at least one chamber with an inert gas; and d) pumping down said at least one chamber to remove the contents thereof.

12. A computer readable medium in accordance with claim 11, wherein said at least one chamber has on interior surface thereof, a protective coating of a material selected from the group consisting of titanium and titanium nitride, further comprising the steps of, following step d):

depositing the protective coating on the interior surfaces of said at least one chamber.

13. The computer readable medium in accordance with claim 11, wherein the elevated temperature is in the range of approximately 500–700° C.

14. The computer readable medium in accordance with claim 11, wherein step a) is performed for approximately 5–50 seconds, and step b) is performed for approximately 2–20 seconds.

15. The computer readable medium in accordance with claim 11, wherein the chlorine gas in step a) is admixed with up to 99.9% by volume of an inert gas.

16. The computer readable medium in accordance with claim 15, wherein the inert gas is selected from the group consisting of argon, nitrogen and helium.

17. The computer readable medium in accordance with claim 15, wherein the inert gas utilized in step c) is the same as utilized in step a).

18. The computer readable medium in accordance with claim 11, wherein step b) is performed at an RF power of approximately 50–900 Watts.

19. The computer readable medium in accordance with claim 18, wherein the power in step c) is reduced to approximately one-half the level utilized in step b).

20. The computer readable medium in accordance with claim 11 further comprising the step of inserting a placebo wafer into the chamber prior to step a).

21. The computer readable medium in accordance with claim 11 further comprising the step of purging the chamber prior to step a).

22. The computer readable medium in accordance with claim 11 herein the computer readable medium is performed between processing of individual semiconductor wafers.

23. The computer readable medium in accordance with claim 11 further comprising the step of depositing a protective coating of material in the chamber following step d).

24. The computer readable medium in accordance with claim 23, wherein the protective coating is selected from the group consisting of titanium and titanium nitride that is deposited on the interior surfaces of the chamber by chemical vapor deposition.

25. The computer readable medium in accordance with claim 23, wherein the protective coating is between about 50 Å and 1$\mu$ thick.

* * * * *

UNITED STATES PATENT AND TRADEMARK OFFICE
CERTIFICATE OF CORRECTION

PATENT NO. : 6,482,746 B2
DATED : November 19, 2002
INVENTOR(S) : Anand Vasudez et al.

It is certified that error appears in the above-identified patent and that said Letters Patent is hereby corrected as shown below:

<u>Title page,</u>
Item [57], ABSTRACT,
Line 13, please change "sur aces" to -- surfaces --.
Line 14, please change "he" to -- the --.

<u>Column 3,</u>
Line 62, beginning with "in accordance with", should be a new paragraph.

<u>Column 7,</u>
Line 33, please change "c+," to -- C+, --

Signed and Sealed this

Seventh Day of October, 2003

JAMES E. ROGAN
*Director of the United States Patent and Trademark Office*